United States Patent [19]

Saka

[11] Patent Number: 4,541,123
[45] Date of Patent: Sep. 10, 1985

[54] MIXER CIRCUIT

[75] Inventor: Hiroshi Saka, Katano City, Japan

[73] Assignee: Matsushita Electric Industrial Co., Ltd., Kadoma, Japan

[21] Appl. No.: 526,279

[22] Filed: Aug. 25, 1983

[30] Foreign Application Priority Data

Aug. 30, 1982 [JP] Japan .................................. 57-150558
Aug. 30, 1982 [JP] Japan .................................. 57-150561

[51] Int. Cl.³ .............................................. H04B 1/26
[52] U.S. Cl. .................... 455/325; 455/327; 455/330
[58] Field of Search ............... 455/325, 327, 328, 330, 455/318, 319, 323; 331/107 SL

[56] References Cited

U.S. PATENT DOCUMENTS 4,211,977 7/1980 Shinkawa et al. ................... 455/327
4,331,940 5/1982 Uwano ........................... 331/107 SL
4,445,097 4/1984 Godart et al. ................. 331/107 SL
4,450,584 5/1984 Saka et al. ........................... 455/325

Primary Examiner—Jin F. Ng
Attorney, Agent, or Firm—Cushman, Darby & Cushman

[57] ABSTRACT

A mixer circuit in which resonance characteristics of a resonance circuit coupled to the RF input terminal are prevented from entering the mixer circuit, and in which negative resistance characteristics in the local oscillator circuit are prevented from causing spurious oscillations in the mixer circuit. The mixer circuit comprises a main strip line connecting an RF input terminal to an output terminal through a frequency mixing diode and a low pass filter. The IF signal is short circuited where the mixer diode is connected to the main strip line, by a high frequency short-circuiting technique. An IF interrupt circuit is provided in the main strip line near the RF input. A resistor ended low pass filter is connected between the RF terminal and the IF interruption circuit. The local oscillator includes a strip line having a length equal to one quarter of the wavelength of the spurious oscillation which is to be prevented.

5 Claims, 7 Drawing Figures

MIXER CIRCUIT

BACKGROUND OF THE INVENTION

1. Field of the invention

This invention relates to a microwave integrated circuit mixer (MIC mixer) using a strip line or a microstrip line, etc. for outputting an IF signal with a frequency equal to the difference between the frequencies of the input radio frequency signal and a local oscillation signal (LO signal).

2. Description of a Prior Art

FIG. 1 shows a typical example of a prior art MIC mixer configuration. In the FIG. 1 circuit, a radio frequency signal (hereinafter RF signal) fed through an RF input terminal 1 propagates on a main line 2 and is supplied to a mixer diode 3, i.e., a frequency mixing element. A local oscillation signal (hereinafter LO signal) generated in a microwave oscillator 4 is given to the mixer diode 3 after passing through a band-pass filter (BPF) 5 for the LO signal which is coupled to the main line 2 at the respective high frequencies and passes only the LO signal selectively. Then the output of the mixer diode 3 is supplied to an IF signal output terminal 7 through a low-pass filter 6 which passes only the IF signal, and an end A of the mixer diode 3 is short-circuited for the RF signal and for the LO signal by a high frequency short-circuiting technique where a ¼ wavelength transmission line is used. In the conventional apparatus of FIG. 1, the input terminal 1 is connected to the main line 2 through an IF interruption circuit 8 which has a passing characteristic for the input RF signal, but works as an open circuit impedance for the IF signal and is provided on the main line 2 at a distance of ¼ wavelength of the IF signal ($\simeq\frac{1}{4}\lambda_{if}$) from the mixer diode 3. Accordingly, the input side terminal "B" of the mixer diode 3 becomes short-circuited to a ground in the IF signal frequency. In the microwave oscillator 4, a high frequency use FET 21 is provided in a manner that drain terminal 22 thereof is connected to a strip line 23 which has ¼ wavelength of the oscillation frequency, and the strip line 23 is open ended. The gate terminal 24 of the FET 21 is connected to one end of a strip line 25, and the other end of the strip line 25 is ground through a dummy resistor 26. A dielectric resonator 27 is disposed so as to be coupled with the strip line 25. The source terminal 28 of FET 21 is connected to one end of a strip line 29, the other end of which is grounded through a dummy resistor 19, so that the output of the oscillator which oscillates at a resonance frequency of the dielectric resonator 27 is taken out from the strip line 29 and fed to the mixer diode 3 through a filter circuit 29+5 and the main line 2. A low-pass filter 30 for feeding a bias current consists of a high impedance line part and a low impedance line part. The low impedance line part of the low-pass filter 30 is connected through a resistor 31 to a capacitor 32, and a bias power source is fed through a connection point between the resistor 31 and the capacitor 32. As the IF interruption circuit 8, a band-pass filter which has a small insertion loss for RF signals and a wide pass-band, and in actual practice may be an inter-digital type direct-current block where two open-ended strip lines are parallel-coupled over a length nearly equal to ¼ wavelength ($\lambda_s/4$) of the RF signal from the open end as shown in FIG. 2, can be used. The capacitance due to a gap between the two open-ended strip-lines parallel-coupled is, for example, several 0.01 pF when the frequency of a RF signal is 12 GHz, and accordingly, the impedance of the gap capacitance becomes several kΩ when the IF frequency is 1 GHz, and the impedance can be ragarded as almost an open-circuit impedance. However, if a resonance circuit having a resonance characteristic in a frequency range of the IF signal is constituted in a circuit to be connected to the RF input terminal 1, then the gap capacitance of the IF interruption circuit 8 will work as a coupling capacitance, and accordingly, an impedance seen from the terminal "B" of the mixer diode 3 towards the IF interruption circuit 8 begin to have resonance characteristics, and the terminal "B" of the mixer diode 3 is not short-circuited to a ground around the resonance frequency.

Accordingly, the output impedance for the IF frequency at the output terminal 7 is greatly influenced around the resonance frequency, and the condition of the output matching at the IF signal is greatly influenced. As a summary, the frequency spectral characteristic of the mixer circuit begins to display a steep defect phenomenon, which is a fatal defect of the mixer circuit.

Furthermore, in a microwave oscillator 4, the gain of the transistor increases generally as the frequency becomes lower, and accordingly, a spurious oscillation is likely to be produced. In generally, in FIG. 1, provided that a reflection coefficient seen from the gate 24 of FET 21 towards FET 21 is $S_{11}$ and a reflection coefficient seen from the gate terminal 24 towards the dummy resistor 26 is $\Gamma_R$, then the oscillation is carried out when the following condition is fulfilled:

$$S_{11} \times \Gamma_R = 1 \tag{1}$$

Accordingly, when the resonance circuit is set in a manner that the reflection coefficient $\Gamma_R$ is $|\Gamma_R| \simeq 1$ only for the frequency around the resonance frequency of the dielectric resonator 27, and $|\Gamma_R| \simeq 0$ for the frequency other than the resonance frequency, then the microwave oscillator 4 of FIG. 1 stably oscillates at a resonance frequency of the dielectric resonator 27. Hereupon, though the resistor 26 is constituted to have the reflection coefficient $|\Gamma| \simeq 0$ in a frequency band of the used frequency, it is not always so for the frequency lower than or higher than the resonance frequency. For instance, when a dummy resistor comprising a 50Ω resistor and a ¼ wavelength opened-ended strip line are used, the above-mentioned dummy resistor shows a characteristic of $|\Gamma| \simeq 0$ for the frequency range of lower than 1 GHz or 7–14 GHz when the LO frequency is 11 GHz, but is shows a characteristic of $|\Gamma| \simeq 1$ for the frequency range of 2–6 GHz. On the other hand, the FET 21 has a tendency to increase its gain as the frequency becomes lower, accordingly the reflection coefficient $|S'_{11}|$ for a small signal seen from the gate terminal 24 towards FET 21 begins to display a negative characteristic to a low frequency, and accordingly $|S_{11}'| > 1$. Accordingly, even for the frequency range of $|\Gamma| \simeq 1$ except for the LO frequency, the oscillation condition of $S_{11} \times \Gamma_R = 1$ can be satisfied, and this becomes the cause of a spurious oscillation, which is likely to be induced in a frequency range of 3–5 GHz.

SUMMARY OF THE INVENTION

A purpose of the present invention is to provide a mixer circuit wherein fatal defects of frequency characteristics in the IF range are prevented by providing meons which prevent the IF interruption circuit from working as a coupling capacitance, and a spurious oscillation at a frequency lower than the LO signal frequency is prevented by minimizing the reflection coefficient $|S_{11}'|$ seen from the gate terminal or base terminal of an oscillation transistor towards the oscillation transistor thereby to eliminate or minimize negative resistance in the LO circuit, thereby a desired normal LO signal is given to a mixer diode. Further, in the present invention, by connecting a resistor-ended low-pass filter to a main line at a point which is on a side of the RF input terminal with respect to and IF interruption circuit and of a high impedance for intermediate frequency, the occurrence of resonance of an impedance seen from the IF interruption circuit towards the RF signal input terminal within the IF range will be prevented. In a microwave oscillator of a mixer circuit, by using a strip line having a length equal to ¼ wavelength of a spurious oscillation frequency and having one end open and having the other end connected to one end of a resistor which is connected by its other end to a low-pass filter for a bias feeding circuit constituted by a high impedance line and a low impedance line, an impedance seen from a bias connection terminal of an oscillation transistor towards the low-pass filter is adjusted to have a matching condition fulfilled, thereby to eliminate or drastically decrease negative resistance in the local oscillator to prevent spurious oscillation.

DESCRIPTION OF THE PREFERRED EMBODIMENTS

Figure 1:
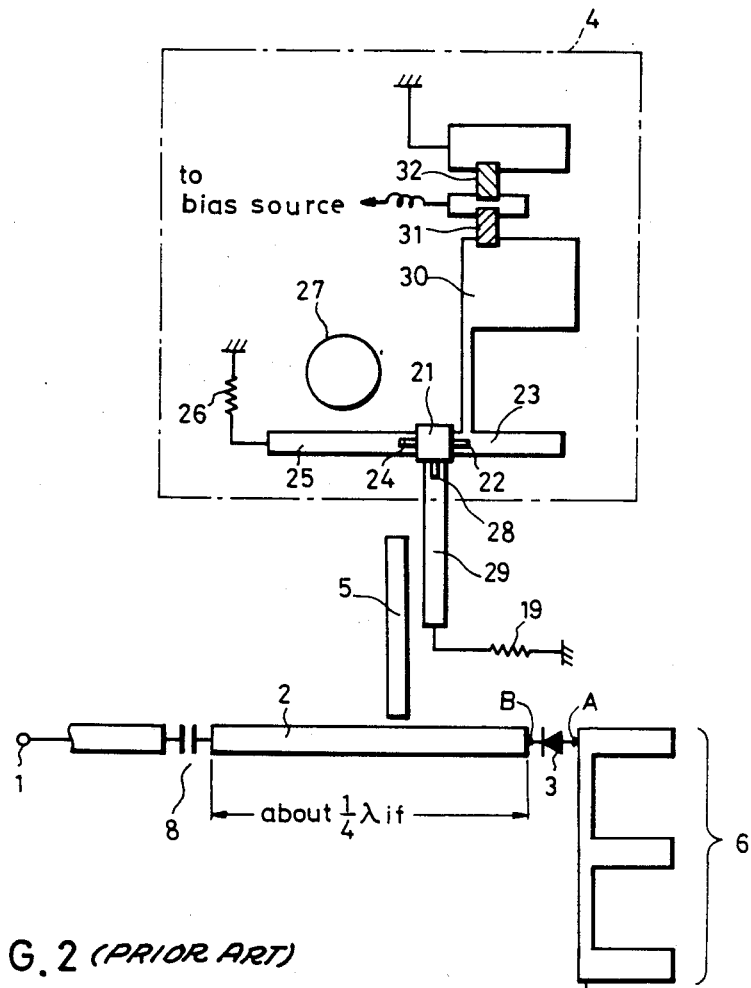
FIG. 1 is the pattern diagram of the conventional example of a prior art mixer circuit.
Figure 2:
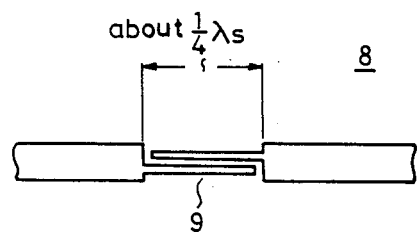
FIG. 2 is the pattern diagram of a ¼ wavelength line coupling type inter-digital direct current block according to the prior art.

Hereinafter, the present invention will be made more apparent from the following detailed description taken in conjunction with the drawings FIG. 3 to FIG. 7, wherein the same numerals are put on the same parts and components as those shown in FIG. 1 and FIG. 2.

The mixer circuit comprises a local oscillator 4', a band-pass filter 5 for passing only a LO signal, a strip line 29 ended with a dummy resistor 19 and coupled to the band-pass filter 5 to feed the LO signal thereto, a main line 2 coupled to the band-pass filter 5 to receive the LO signal, an IF interruption circuit 8 connected between the RF input terminal 1 and the input side of the main line 2, a mixer diode 3 connected at an output side of the main line 2 and a low-pass filter 6 connected between the output terminal of the mixer diode 3 and an output terminal 7. The low-pass filter 6 is for passing only IF signal to the output terminal 7 and short-circuits the output end A of the mixer diode 3 to a ground in the RF frequency and the LO frequency. The IF output is issued at and taken out from the output terminal 7. The IF interruption circuit 8 is a capacitor which passes input RF signal from the input terminal 1, but works as open impedance against IF signal and is disposed at a point of ¼ wavelength of the IF signal ($\simeq \frac{1}{4}\lambda_{if}$) from the output end B on the main line 2. One end of another low-pass filter 10 is connected at a point which is between the RF input terminal 1 and the IF interruption circuit 8 and is a high impedance point for the IF signal. And the other end of the low-pass filter 10 is ended with an ending circuit 11 which comprises a resistor 15 and a bypass capacitance 16.

In the microwave local oscillator 4', an oscillation transistor such as FET 21 is connected by its drain terminal to one end of a strip line 23 of about ¼ wavelength of the oscillation frequency with its other end open ended, by its source terminal to the strip line 29, and by its gate terminal to one end of a strip line 25 which is terminated at its other end with a dummy resistor 6. The strip line 25 is coupled with a dielectric resonator 27. The other end of the strip line 29 is ended with a dummy resistor 19. A low-pass filter 30 for connection to a bias source circuit and consisting of a high impedance line part and a low impedance line part is connected to the strip line 23 with its high impedance line part, and the other end of the low-pass filter 30 is connected through a resistor 31 to the bias feeding source. A strip line 33 having about ¼ wavelength of a spurious oscillation frequency with one end open-ended is connected at the other end to the junction point J of the resistor 31 at the bias source circuit. A capacitor 32 for direct current blocking and high frequency bypassing is connected to the junction point J.

An input side point C of the main line 2 is of a high impedance for IF signals, and a low-pass filter 10 ended with a resistor 15 and a capacitor 16 is connected to the point C. Accordingly, even when a resonance circuit is formed at the point of the RF signal input terminal 1, such a resonance circuit is damped by the resistor of the ending circuit 11. Therefore, the impedance seen from the input side end B of the mixer diode toward the IF interruption circuit 8 does not have undesirable resonance characteristic in impedance, and the input end B is certainly short-circuited to a ground for IF signals, thereby the fatal defect of prior art mixer circuits can be prevented.

In the microwave local oscillator 4', the reflection coefficient $|\Gamma d|$ seen from the drain terminal 22 towards the low-pass filter 30 becomes small for the spurious oscillation frequency. This is because, by means of the open-ended strip line 33 being about ¼ of the wavelength of the spurious oscillation frequency, the junction point J is short-circuited to a ground in the spurious oscillation frequency regardless of the state of impedance seen from the junction point J toward the ground point 34, and therefore the resistor 31 works as a damping resistor. Accordingly, a reflection coefficient $S_{11}'$ seen from the gate terminal 24 of the FET 21 towards the FET 21 decreases or loses characteristics of negative resistance for the spurious oscillation signal, and thereby, the spurious oscillation is prvented.

Figure 3:
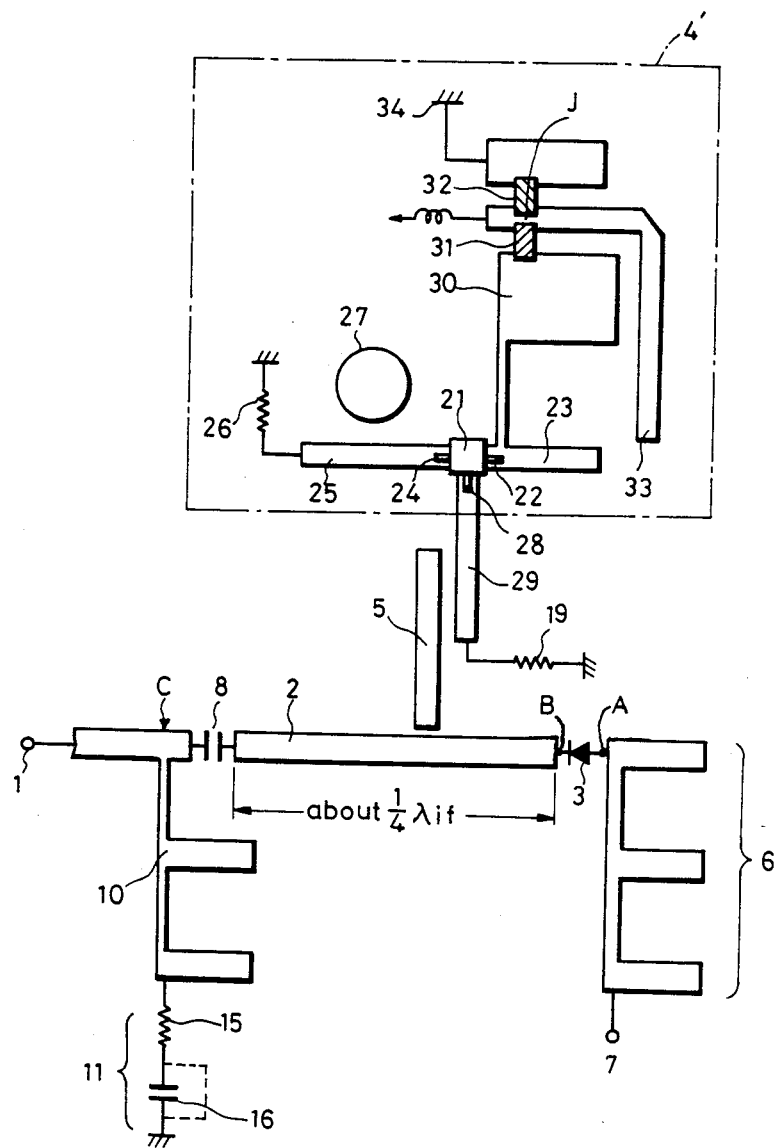
FIG. 3 is a pattern diagram of a first example embodying the present invention.
Figure 4:
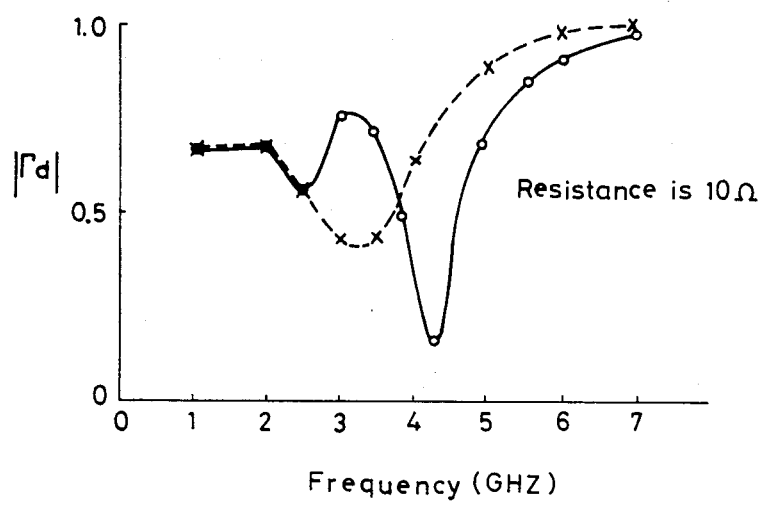
FIG. 4 is a frequency spectral diagram of a reflection coefficient $|\Gamma d|$ of an impedance seen from the drain terminal of an FET of a microwave oscillator part towards a drain bias circuit side in FIG. 3.

FIG. 4 shows a spectral characteristic of the reflection coefficient $|\Gamma d|$ seen from the drain terminal 22 of the FET 21 towards the low-pass filter 30 of the embodiment of the present invention in solid curve in comparison with the conventional example shown by broken curve. By selecting the resistance of the resistor 31 and the length of the strip line 33 appropriately, the spurious oscillation can be prevented. For instance, by constituting an oscillator of the oscillation frequency of 11 GHz as shown in FIG. 1, a spurious oscillation was produced at about 4 GHz, but by adopting the constitution of FIG. 3, and selecting the resistance of the resistor 31 to be several Ω to 60 Ω the spurious oscillation of the about 4 GHz was eliminated.

In the example of FIG. 3, only by adding the strip line 33 in the total oscillator 4', can the spurious oscillation be effectively eliminated. For a change of the spurious oscillation frequency, the line length of the strip line 33 can be easily changed, and therefore the present invention is effective against spurious oscillation for a wide range of frequencies. Furthermore, since the resistance of the resistor 31 can be changed in a wide range from several Ω to about 60Ω, the value of the resistor can be selected corresponding to the voltage of the bias source, and this is another great advantage.

Figure 5:
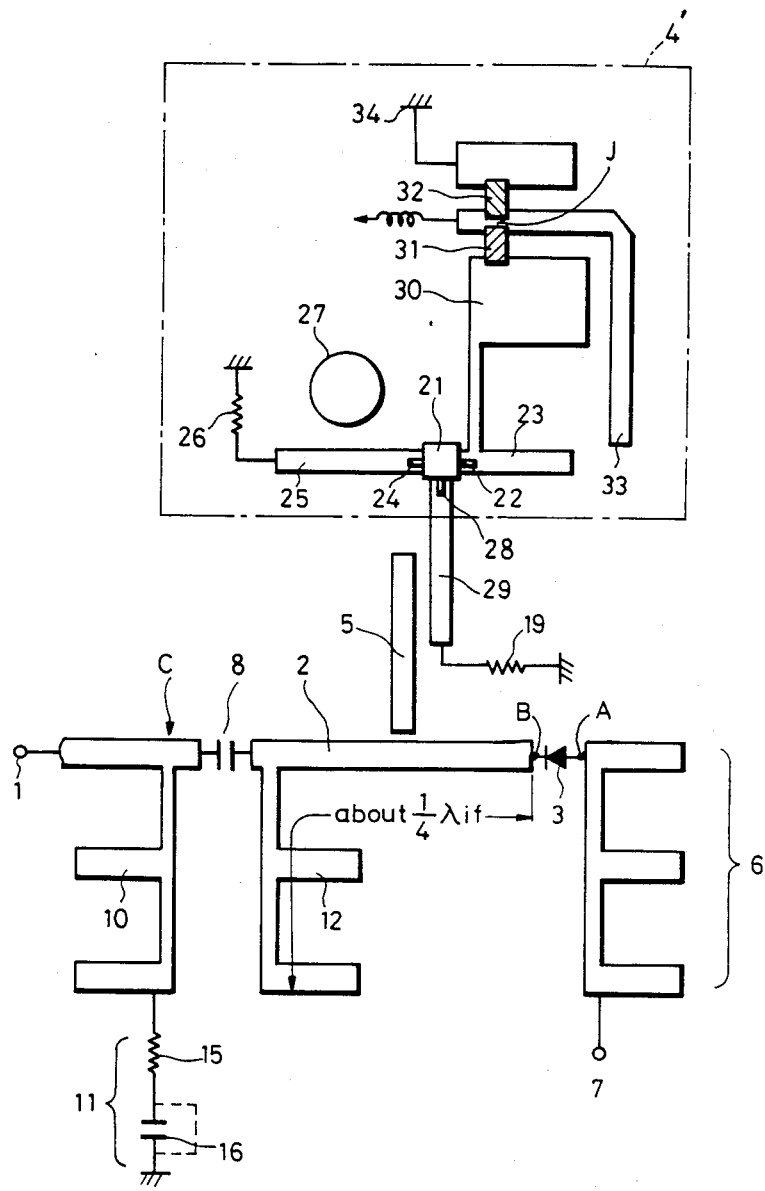
FIG. 5 is a pattern diagram of another example embodying the present invention.

FIG. 5 is another example embodying the present invention wherein the local oscillator 4' is substantially the same as that of FIG. 3, but another low-pass filter 12 of open end type is connected to the main line 2 at a point close to the IF interruption circuit 8 on the side of the mixer diode 3 with respect to the IF interruption circuit 8, and a length from the open end of the low-pass filter 12 to the end B of the main line 2, connected to the mixer diode 3, is selected to be ¼ wavelength of the IF signal ($\simeq \frac{1}{4}\lambda_{if}$). Other parts are substantially the same as the circuit of FIG. 3.

In this example of FIG. 5, since the low-pass filter 10 is connected to the main line 2 at the high impedance point C for the IF signal, even when an undesirable resonance circuit is coupled to the RF input terminal 1, such a resonance circuit is damped by the ending circuit 11 containing the resistor 15. Furthermore, by providing the open ended low-pass filter 12, the transmission loss of the main line 2 for the RF signal can be reduced to a minimum value even under a condition that the frequency of the IF signal is low, without making the line length of the main line 2 longer, but only making the line length of the low-pass filter 12 longer.

Figure 6:
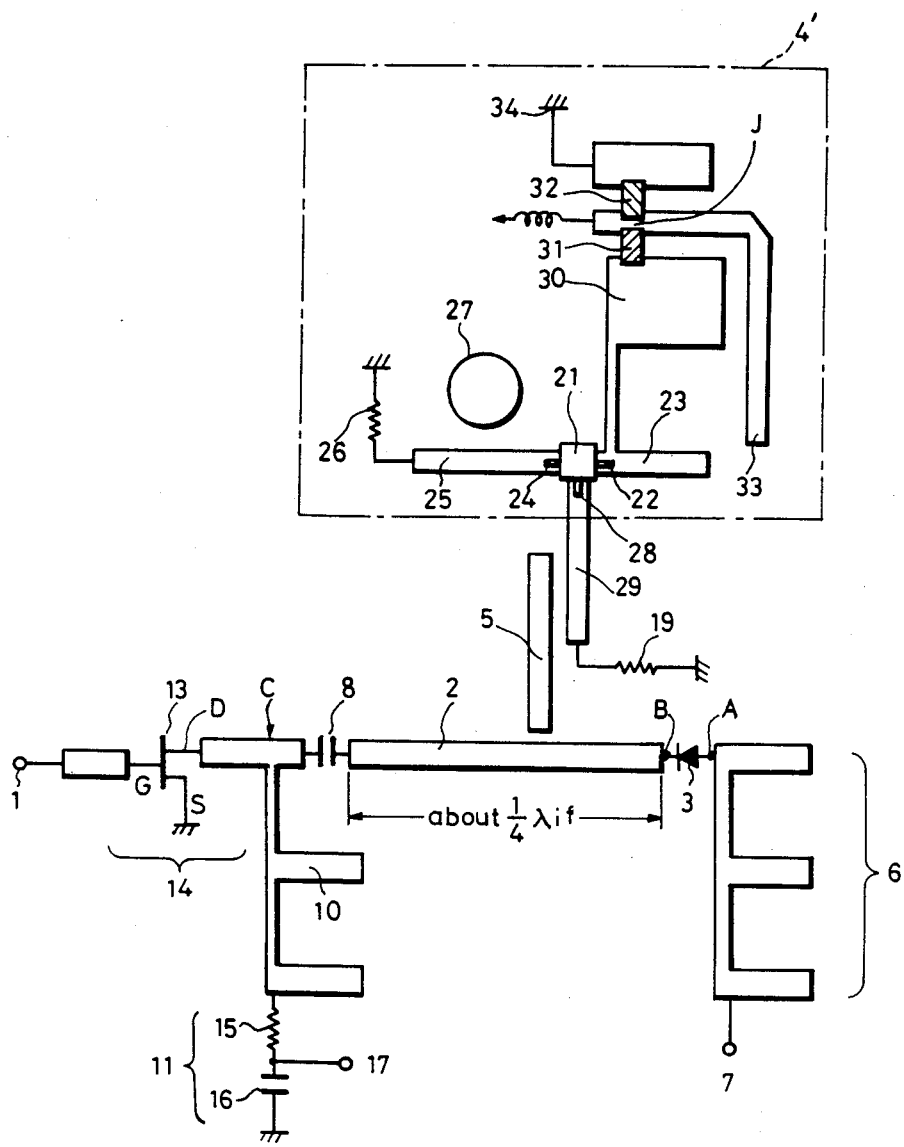
FIG. 6 is a pattern diagram of another example embodying the present invention.

FIG. 6 is still another embodiment of the present invention. The local oscillator 4' is substantially the same as that of FIG. 3, and a FET 13 comprising an amplifier is connected by its gate G to the RF signal input terminal 1, by its drain D to an end of the main line 2 and by its source S to ground. Other parts and components are constituted in the same manner as those of the circuit of FIG. 3, but the drain bias of the FET 13 is supplied from a terminal 17 which is connected between a capacitor 16 and a resistor 15 of an ending circuit 11.

In the example of FIG. 6, the resistor ended low-pass filter 10 is connected to the main line at the latter's point C of high impedance for the IF signal, and accordingly, even when an undesirable resonance circuit is formed in the side of the FET amplifier 4, the resonance circuit is damped by the resistance 15 of the ending circuit 11. As a result, the impedance seen from the input side end B of the mixer diode 3 toward the IF interruption circuit 8 will have no resonance characteristics, and the point B is certainly short-circuited to ground for the IF signal, and the fatal defect produced in the prior art mixer circuit can be prevented. Furthermore, since the low-pass filter 10, the resistor 15 and the bypass capacitor 16 also form the drain bias circuit for the FET amplifier 14, there is no need of providing an individual bias circuit for the FET amplifier 14, apart from the resonance prevention circuit for the mixer circuit, and therefore the circuit can be made small and concise. And furthermore, since the resistor ended low-pass filter 10 is connected to the main line 2 at the high impedance point C, it is effective to prevent undesirable spurious oscillation which is liable to occur in the bias circuit 11.

Figure 7:
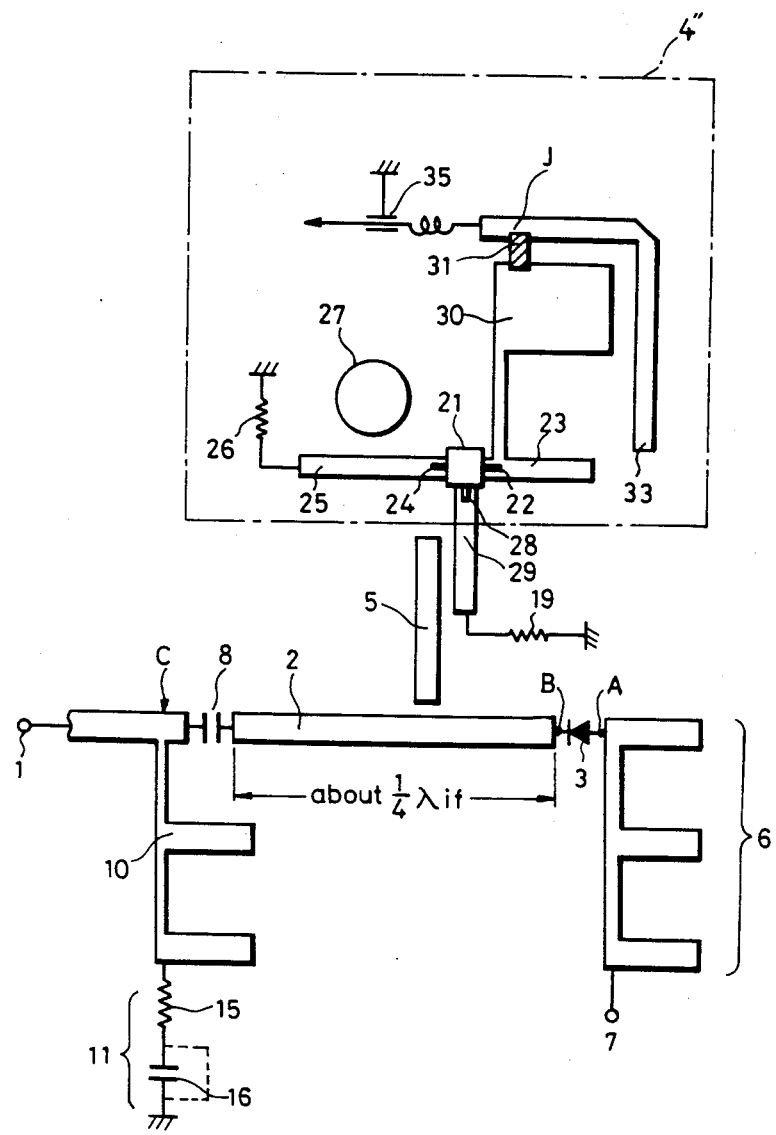
FIG. 7 is a pattern diagram of another example embodying the present invention.

FIG. 7 shows a still another embodiment, wherein the microwave local oscillator 4'' is modified. In this example, a penetration type capacitor 35 is employed in place of the ordinary capacitor 32 of FIG. 3, and other parts and components are substantially the same as those of FIG. 3. Accordingly, the technical advantage and merits in preventing spurious oscillation by the strip line 33 and the resistor 31 are the same as that of FIG. 3. However, in this example, as a result of the employment of the penetration type capacitor 35 in a direct current locking and a high frequency bypass use, possible variations of local oscillation frequency induced by a spatial shift of the lead wire connecting the junction point J and the bias source can be prevented.

In every one of the above-mentioned embodiments, the oscillation element is not necessarily limited to the FET but a bipolar transistor may be used, and in such case the drain in the above-mentioned elucidation should be changed to the collector and the gate to the base and the source to the emitter, respectively. As has been elucidated in detail, according to the present invention, a steep defect in spectral characteristics in the intermediate frequency range of the mixer circuit can be prevented, and a microwave mixer circuit with splended characteristics is obtainable. Besides, in its microwave oscillator, undesirable spurious oscillations can be prevented for a wide frequency range only by adding an open-ended strip line of ¼ wavelength of a spurious oscillation frequency. Furthermore, as the damping resistor to prevent the spurious oscillation, a resistor of a wide range such as from several Ω to about 60Ω can be used, thereby enabling a wide range selection of drain or collector bias resistors for various values of voltage of the bias voltage source.

What is claimed is:
1. A mixer circuit comprising:
RF input means for receiving RF signals;
a main line having first and second ends, said first end being connected to said RF input means;
a frequency mixing device having first and second ends, said frequency mixing device first end being connected to said main line second end;
means for short-circuiting said frequency mixing device first end to ground at the frequency of an IF signal;
local oscillating means for providing a local oscillator (LO) signal;
means for impressing said LO signal onto said main line;
filter means, connected to said frequency mixing device second end, for passing only IF signals having a frequency which is equal to a difference between RF and LO signal frequencies;
IF interruption means, provided in said main line, for passing said RF signal but impeding said IF signal; and
resonance damping means, connected to said main line between said RF input means and said IF interruption means, for damping a resonance in a frequency range of said IF signal.

2. A mixer circuit in accordance with claim 1, wherein said resonance damping means includes a first low-pass filter having a first end connected to said first end of said main line a second end of said first low-pass filter being resistor-ended.

3. A mixer circuit in accordance with claim 2, further including an amplifier connected between said RF input means and said main line, and wherein said first low-pass filter is connected as a bias circuit of said amplifier.

4. A mixer circuit in accordance with claim 1, wherein said local oscillating means includes:
   an oscillator device having first and second terminals;
   a first open-ended transmission line having a length equal to ¼ wavelength of said LO signal and connected to said oscillation device first terminal;
   a resonance circuit, including a resistor-ended transmission line and a dielectric resonator coupled thereto, connected to said oscillation device second terminal;
   a bias-resistor having first and second ends;
   a second low-pass filter connected between said first open-ended transmission line and said bias-resistor first end; and
   a second open-ended transmission line connected to said bias-resistor second end and having a length equal to substantially ¼ wavelength of a spurious oscillation to be eliminated, wherein a junction point of said bias resistor and said second open-ended transmission line is adapted to be connected to a bias source.

5. A mixer circuit in accordance with claim 4, wherein the resistance of said bias-resistor is selected in such a manner that a reflection coefficient of an impedance of said second low-pass filter, as seen from said oscillation device first terminaL towards said second low-pass filter, becomes sufficiently small for a frequency of said spurious oscillation.

* * * * *